US006878628B2

(12) United States Patent
Sophie et al.

(10) Patent No.: US 6,878,628 B2
(45) Date of Patent: Apr. 12, 2005

(54) IN SITU REDUCTION OF COPPER OXIDE PRIOR TO SILICON CARBIDE DEPOSITION

(75) Inventors: Auguste J. L. Sophie, Heverlee (BE); Hessel Sprey, Kessel-Lo (BE); Pekka J. Soininen, Espoo (FI); Kai-Erik Elers, Portland, OR (US)

(73) Assignee: ASM International NV, Bilthoren (NL)

( * ) Notice: Subject to any disclaimer, the term of this patent is extended or adjusted under 35 U.S.C. 154(b) by 0 days.

(21) Appl. No.: 09/975,466

(22) Filed: Oct. 9, 2001

(65) Prior Publication Data

US 2002/0098685 A1 Jul. 25, 2002

(51) Int. Cl.[7] .............................. H01L 21/44; B05D 5/12
(52) U.S. Cl. ......................... 438/687; 427/123; 427/124
(58) Field of Search ........................ 438/687; 427/123, 427/124

(56) References Cited

U.S. PATENT DOCUMENTS

| | | | |
|---|---|---|---|
| 4,058,430 A | 11/1977 | Suntola et al. ............... 156/611 |
| 5,382,333 A | 1/1995 | Ando et al. | |
| 5,711,811 A | 1/1998 | Suntola et al. ............... 118/711 |
| 5,731,634 A | 3/1998 | Matsuo et al. ............... 257/752 |
| 5,865,365 A | * 2/1999 | Nishikawa et al. .......... 228/223 |
| 5,939,334 A | 8/1999 | Nguyen et al. ............. 438/689 |
| 6,006,763 A | * 12/1999 | Mori et al. .................... 134/1.1 |
| 6,033,584 A | 3/2000 | Ngo et al. ...................... 216/67 |
| 6,066,892 A | 5/2000 | Ding et al. .................. 257/751 |
| 6,124,189 A | 9/2000 | Watanabe et al. ........... 438/586 |
| 6,130,123 A | 10/2000 | Liang et al. ................. 438/217 |
| 6,143,658 A | * 11/2000 | Donnelly et al. ............ 438/687 |
| 6,303,500 B1 | 10/2001 | Jiang et al. .................. 438/678 |
| 6,323,131 B1 | 11/2001 | Obeng et al. ................ 438/687 |
| 6,346,151 B1 | 2/2002 | Jiang et al. .................. 118/403 |
| 6,433,432 B2 | * 8/2002 | Shimizu ....................... 257/758 |
| 6,444,568 B1 | * 9/2002 | Sundararajan et al. ....... 438/627 |
| 6,482,740 B2 | * 11/2002 | Soininen et al. ............. 438/686 |
| 2001/0003064 A1 | * 6/2001 | Ohto ............................ 438/687 |
| 2001/0018266 A1 | 8/2001 | Jiang et al. .................. 438/678 |
| 2001/0052318 A1 | 12/2001 | Jiang et al. .................. 118/403 |
| 2002/0027286 A1 | * 3/2002 | Sundararajan et al. ....... 257/751 |

FOREIGN PATENT DOCUMENTS

| | | |
|---|---|---|
| DE | 41 08 73 | 3/1925 |
| EP | 0 469 470 A1 | 2/1992 |
| EP | 0 880 168 A2 | 11/1998 |
| GB | 2 340 508 A | 2/2000 |
| WO | WO 93/10652 | 5/1993 |
| WO | WO 00/03420 | 1/2000 |

OTHER PUBLICATIONS

Ueno, et al. "Cleaning of CHF3 plasma–etched SiO2/SiN/Cu via structures using a hydrogen plasma, an oxygen plasma, and hexafluoroacetylacetone vapors" Journal of Vacuum Science and Technology, B 16(6), Nov./Dec. 1998, pp. 2986–2995.*

SOI Technology: IBM's Next Advance In Chip Design, Date unknown.

Fukuzumi, Y. et al., "Liner–Supported Cylinder (LSC) Technology to realize Ru/Ta₂O₅/Ru Capacitor for Future DRAMs," *IEEE,* IED 2000, Session 34 (2000).

(Continued)

*Primary Examiner*—Erik Kielin
(74) *Attorney, Agent, or Firm*—Knobbe, Martens, Olson & Bear LLP (57) ABSTRACT

The invention relates generally to improved silicon carbide deposition during dual damascene processing. In one aspect of the invention, copper oxide present on a substrate is reduced at least partially to copper prior to deposition of a silicon carbide or silicon oxycarbide layer thereon. In the preferred embodiment the reduction is accomplished by contacting the substrate with one or more organic reducing agents. The reduction process may be carried out in situ, in the same reaction chamber as subsequent processing steps. Alternatively, it may be carried out in a module of a cluster tool.

21 Claims, 9 Drawing Sheets

OTHER PUBLICATIONS

Hones, P. et al., "MOCVD of ThinRuthenium Oxide Films: Properties and Growth Kinetics," *Chem. Vap. Deposition*, vol. 6, No. 4, pp. 193–198 (2000).

Inoue, N. et al., "Low thermal–budget fabrication of sputtered–PZT capacitor on multilevel interconnects for embedded FeRAM," *IEEE*, IED 2000, Session 34 (2000).

Jung, D. et al., "A Novel Ir/IrO$_2$/Pt–PZT–Pt/IrO$_2$/Ir Capacitor for A Highly Reliable Mega–Scale FRAM," *IEEE*, IED 2000, Session 34, (2000).

Solanki R. et al., "Atomic Layer Deposition of Copper Seed Layers," *Electrochemical and Solid–State Letters*, vol. 3, No. 10, pp. 479–480 (2000).

Sundani et al., Oral presentation of dual damascene process, slides.

Utriainen, M. et al., "Studies of metallic thin film growth in an atomic layer epitaxy reactor using M(acac)$_2$ (M=Ni, Cu, Pt) precursors," *Applied Surface Science*, vol. 157, pp. 151–158 (2000).

Won, Seok–Jun et al., "Conformal CVD–Ruthenium Process for MIM Capacitor in Giga–bit DRAMs," *IEEE*, IED 2000, Session 34 (2000).

Xu, P. et al., "A Breakthrough in Low–k Barrier/Etch Stop Films for Copper Damascene Applications," *Semiconductor Fabtech*, 11th Edition, p. 239 (2000).

Yoon, Dong–Soo et al., "Investigation of RuO$_2$–Incorporated Pt Layer as a Bottom Electrode and Diffusion Barrier for High Epsilon Capacitor Applications," *Electrochemical and Solid–State Letters*, vol. 3, No. 8, pp. 373–376 (2000).

Poster presentation. Soininen. P. and Elers. K.E., Advanced Metallization Conference, Oct. 8–11, 2001, Montreal, Canada.

Satta et al., "The Removal of Copper Oxides by Ethyl Alcohol Monitored in Situ by Spectroscopic Ellipsometry," Journal of The Electromechanical Society, 150 (5), pp. 300–306 (2003).

Yagishita et al., "Cleaning of Copper Surface Using Vapor–Phase Organic Acids," Materials Researching Society Spring 2003 Meeting, Symposium E, Session E, Paper E3.28.

Sundani et al., "Oral presentation of dual damacene process" slides.

Baglia, J., Associate Editor, "New Designs and Materials Tackle 1 Gb Memory Challenge," *Semiconductor International*, World Wide Web address: semiconductor.net, Nov. 2000.

Basceri, C., Ph.D. thesis, "Electrical and Dielectric Properties of (Ba,Sr) TiO$_3$ Thin Film Capacitors for Ultra–High Density Dynamic Random Access Memories," pp. 13–31, Raleigh, N.C. State University (1997).

Bursky, D., "Hit Up IEDM For Gigabit And Denser DRAMs And Merged Logic/Memory," *Electronic Design*, World Wide Web address: planetee.com, (Dec. 1, 1998).

Campbell, S.A. et al., "Titanium dioxide (TiO$_2$)–based gate insulators," *IBM J. Res. Develop.*, vol. 43, No. 3, pp. 383–392 (May 1999).

Integrated Circuit Engineering Corporation, Practical Integrated Circuit Fabrication Seminar (1998).

Kawamoto, Y. et al., "The Outlook for Semiconductor Processes and Manufacturing Technologies in the 0.1–$\mu$m Age," *Hitachi Review*, vol. 48, No. 6, pp. 334–339 (1999).

NEC Device Technology International, No. 48, pp. 4–8, (1998).

Onda N. et al., "Hydrogen Plasma Cleaning a Novel Process for IC–Packaging," p. 311, Worldwide Web Address: Semiconductor Fabtech.com (1998).

Ultiainen, M. et al., "Studies of NiO thin film formation by atomic layer epitaxy," *Materials Science & Engineering*, vol. B54, pp. 98–103 (1998).

Winbond News Release, World Wide Web address: winbond.com, (Dec. 13, 2000).

Yoon, Dong–Soo et al., "Tantalum–ruthenium dioxide as a diffusion barrier between Pt bottom electrode and TiSi$_2$ ohmic contact layer for high density capacitors," *Journal of Applied Physics*, vol. 86, No. 5, pp. 2544–2549 (1999).

Yoon, Y.–G. et al., 197th Meeting Program Information II, The Electrochemical Society, 197th Meeting—Toronto, Ontario, Canada May 14–18, 2000, Program Information, I1—Rapid Thermal and Other Short–Time Processing Technologies I, Electronics Division/Dielectric Science and Technology Division/High Temperature Materials Division, 2000, Wednesday, May 17, 2000, New Applications of RTP, Co–Chairs: A. Fiory and D.L. Kwong, Time 11:10 Abs#550, Title: Development of RTA Process for the Crystallization of a–Si Thin Film—Y.–G. Yoon, T.–K. Kim, K.–B. Kim, J.–Y. Cho, B.–I Lee, and S.–K. Joo (Seoul National Univ.).

* cited by examiner

IN SITU REDUCTION OF COPPER OXIDE PRIOR TO SILICON CARBIDE DEPOSITION

REFERENCE TO RELATED APPLICATION

The present application is related to Finnish Patent Application No. 20001163, filed May 15, 2000, abandoned, and PCT Application No. FI01/00473, filed May 15, 2001.

FIELD OF THE INVENTION

The invention relates generally to improved SiC deposition over copper during dual damascene processing.

BACKGROUND OF THE INVENTION

When fabricating integrated circuits, layers of insulating, conducting and semiconducting materials are deposited and patterned to produce desired structures. "Back end" or metallization processes include contact formation and metal line or wire formation. Contact formation vertically connects conductive layers through an insulating layer. Conventionally, contact vias or openings are formed in the insulating layer, which typically comprises a form of oxide such as borophosphosilicate glass (BPSG) or oxides formed from tetraethylorthosilicate (TEOS) precursors. The vias are then filled with conductive material, thereby interconnecting electrical devices and wiring above and below the insulating layers. The layers interconnected by vertical contacts typically include horizontal metal lines running across the integrated circuit. Such lines are conventionally formed by depositing a metal layer over the insulating layer, masking the metal layer in a desired wiring pattern, and etching away metal between the desired wires or conductive lines.

Damascene processing involves forming trenches in the pattern of the desired lines, filling the trenches with a metal or other conductive material, and then etching the metal back to the insulating layer. Wires are thus left within the trenches, isolated from one another in the desired pattern. The etch back process thus avoids more difficult photolithographic mask and etching processes of conventional metal line definition, particularly for copper metallization.

In an extension of damascene processing, a process known as dual damascene involves forming two insulating layers, typically separated by an etch stop material, and forming trenches in the upper insulating layer, as described above for damascene processing. Contact vias are etched through the floor of the trenches and the lower insulating layer to expose lower conductive elements where contacts are desired. As one of skill in the art will recognize, a number of processes are available for forming dual damascene structures. For example, trenches may be etched through the upper insulating layer, after which a further mask is employed to etch the contact vias or the etch continues through a previously defined, buried hard mask. In an alternative embodiment, contact vias are first etched through the upper and lower insulating layers, after which the via in the upper insulating layer is widened to form a trench.

Protective barriers are often formed between via or trench walls and metals in a substrate assembly, to aid in confining deposited material within the via or trench walls.

These lined vias or trenches are then filled with metal by any of a variety of processes, including chemical vapor deposition (CVD), physical vapor deposition (PVD), and electroplating.

Figure 1:
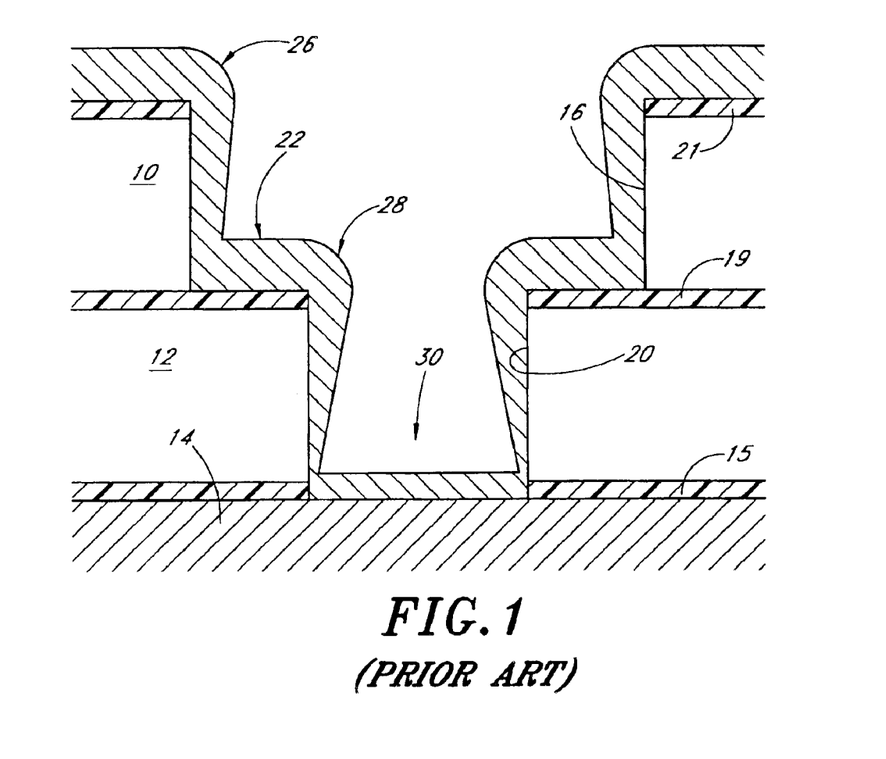
FIG. 1 is a schematic cross-section of a dual damascene structure having a conventional barrier layer lining the trench and contact via thereof.

FIG. 1 illustrates a self-aligned dual damascene process in which an upper insulating layer 10 is formed over a lower insulating layer 12, which is in turn formed over a conductive wiring layer 14, preferably with an intervening barrier layer 15. This barrier layer 15 serves to reduce or prevent diffusion of copper or other conductive material from the underlying runner 14 into the overlying dielectric layer 12 and also serves as an etch stop during via formation.

A mask is employed to pattern and etch trenches 16 and contact vias 20 in a desired wiring pattern. In the illustrated embodiment, the trench 16 is etched down to the level of an etch stop layer 19, which is formed between the two insulating layers 10, 12. In the self-aligned dual damascene process this etch stop layer 19 is typically patterned and etched prior to deposition of the upper insulating layer 10 to form a buried hard mask that defines horizontal dimensions of desired contact vias that are to extend from the bottom of the trench 16. Continued etching through the hard mask 19 opens a contact via 20 from the bottom of the trench 16 to the lower conductive wiring layer 14. FIG. 1 also shows an upper etch stop or chemical mechanical polishing (CMP) stop layer 21 over the upper insulating layer 10 to stop a later planarization step, as will be appreciated by the skilled artisan.

As described briefly above, the etch stop layers in damascene processing typically act as a stop layer during dry-etch or CMP process steps. These stop layers are typically deposited by plasma enhanced CVD (PECVD). While etch stop layers have traditionally been silicon nitride, particularly $Si_3N_4$, more recently silicon carbide (SiC) and silicon oxycarbide (SiOC) have been employed. Some hydrogen may also be incorporated into the etch stop layer during deposition. In acting as a stop layer, the etch stop prevents wear of the underlying insulation material and/or copper layers by an etch or CMP process. Further, an etch stop layer may serve as a diffusion barrier, preventing copper diffusion from copper lines into the insulation layers.

The inventors have found that current deposition of SiC etch stop layers on copper can result in pinholes, higher leakage currents and/or adhesion problems. This can lead to enhanced diffusion of copper into the insulating layer and may result in lower resistance during dry-etch and CMP processes. This, in turn, may lead to loss of etch-selectivity and reduced adhesion of the deposited layers.

Accordingly, a need exists for more effective methods of depositing etch stop layers, particularly in the context of dual damascene metallization.

SUMMARY OF THE INVENTION

In one aspect of the present invention, a process is provided for producing an integrated circuit comprising reducing copper oxide on a substrate by exposure to one or more organic reducing agents prior to deposition of a silicon carbide or silicon oxycarbide layer. In one embodiment the copper oxide layer is left after a chemical mechanical polishing (CMP) step. In another embodiment exposure to a clean room atmosphere forms the copper oxide layer.

The organic reducing agents preferably comprise at least one functional group selected from the group consisting of alcohol (—OH), aldehyde (—CHO), and carboxylic acid (—COOH). Larger reducing agents are particularly preferred to avoid diffusion through the underlying copper.

Copper oxide reduction is preferably carried out in a reaction chamber. In one embodiment reduction of the copper oxide layer and deposition of the silicon carbide or silicon oxycarbide layer take place in the same reaction chamber. In another embodiment silicon carbide or silicon oxycarbide deposition takes place in a reaction chamber that is clustered to the reaction chamber in which copper oxide reduction takes place.

The temperature in the reaction chamber in which the copper oxide layer is reduced is preferably less than about 450° C., more preferably between about 200° C. and about 430° C., and even more preferably about 400° C. Desirably, the reduction and in situ SiC or SiOC deposition are conducted at the same temperature.

According to another aspect, the present invention provides a process for producing an integrated circuit comprising depositing a copper layer on a substrate, contacting the substrate with one or more organic reducing agents and depositing an etch stop layer on the substrate. In one embodiment the etch stop layer comprises silicon carbide. In another embodiment the etch stop layer comprises silicon nitride.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

Though described in the context of certain preferred materials, it will be understood, in view of the present disclosure, that the methods and structures described herein will have application to a variety of other materials. Furthermore, while described in the context of damascene metallization schemes, the skilled artisan will appreciate that the principles and advantages of the processes described herein have application to a variety of process flows, particularly for depositing silicon carbide or silicon oxycarbide over copper.

Definitions

As used herein, the terms "reduction" and "reducing" refer to the removal of oxygen atoms from a copper layer. "Reduction" does not have to be complete reduction, and some oxygen atoms may remain in a copper layer after it has been reduced. Thus, a copper layer that is "reduced" or "at least partially reduced" is a copper layer from which some, but not necessarily all oxygen atoms have been removed.

The term "copper layer" broadly refers to a layer of copper, a layer of copper oxide or a layer that comprises both copper and copper oxide.

As used herein, the term "etch stop layer" broadly refers to any layer that serves to prevent wear of an underlying layer, such as by an etch process or a CMP process. The etch stop layer is preferably comprised of silicon carbide or silicon oxycarbide. A "silicon carbide" or "silicon oxycarbide" etch stop layer may also comprise hydrogen. For example, the hydrogen may be incorporated as a result of the deposition process. Thus, SiC or SiOC as used herein are merely short forms, rather than stoichiometric formulas. Several non-limiting examples of etch stop layers are hard mask layers and CMP stop layers. An "etch stop layer" may also serve additional functions, such as acting as a barrier layer to prevent the diffusion of copper into overlying insulating layers.

Dual Damascene Process Flow

Figure 2:
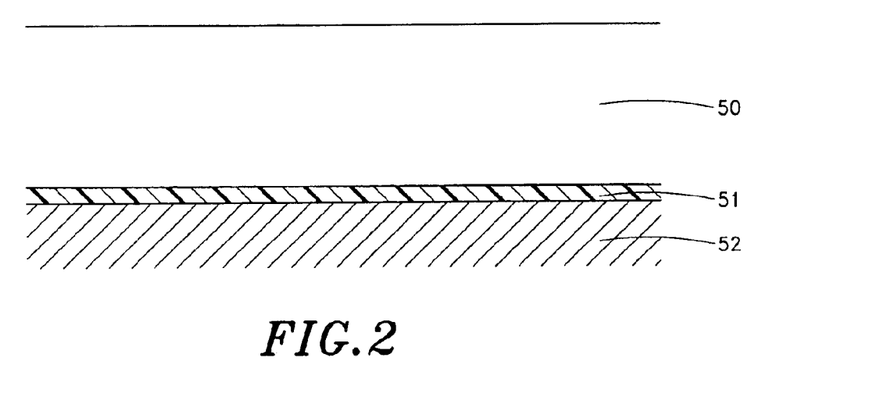
FIGS. 2–9 are schematic cross-sections of a partially fabricated integrated circuit, generally illustrating the construction, lining and filling of a trench and via formed in insulating layers above a semiconductor substrate, in accordance with a preferred dual damascene process flow.

A typical process for producing an integrated circuit (IC) comprises a number of steps, illustrated in FIGS. 2 through 9. Although illustrated in connection with a particular process flow and structure for self-aligned dual damascene metallization, the skilled artisan will appreciate that there are other dual damascene metallization processes and further variations of such schemes for which the methods disclosed herein will have utility. As shown in FIG. 2, a first etch stop layer 51 is deposited on a substrate 52. The substrate typically comprises at least one copper metal layer, such as a conductive element forming part of a lower interconnect layer. The first etch stop layer 51 is capable of stopping a treatment for removing an insulating layer from going further into the structure. A first insulating or dielectric layer 50 is deposited on the first etch stop layer 51. Advantageously, the first etch stop layer 51 also serves as a barrier layer, preventing diffusion of copper into the overlying layer 50.

As will be appreciated by the skilled artisan, metallization schemes typically employ one metal composition throughout various wiring layers (e.g., copper interconnects or aluminum interconnects). The preferred embodiments are particularly adapted to damascene structures wherein the via floor or lower conductive element comprises a highly conductive copper line. The first insulating layer 50 is preferably formed to a thickness sufficient to insulate the lower conductive element 52 from upper wiring structures to be formed.

Figure 3:
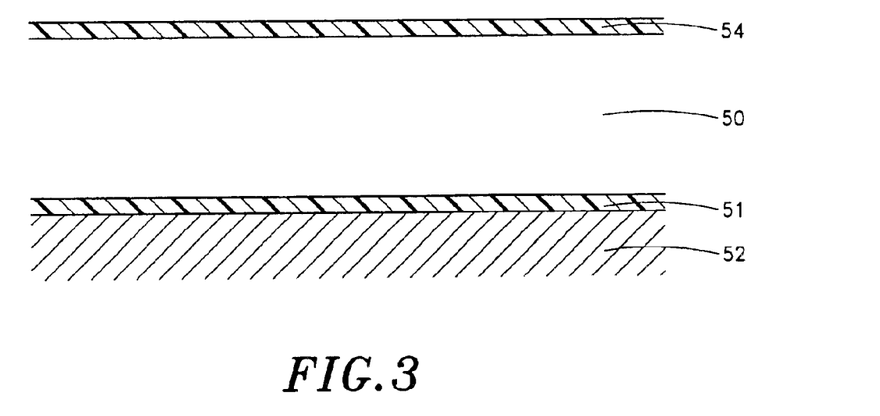

A second etch stop layer 54 is formed over the lower insulating layer 50. A second or upper insulating layer 56 is then formed over the second etch stop layer 54. A third etch stop layer 58 is preferably formed over the upper insulating layer and can be patterned to serve as a hard mask for etching the trenches. The third etch stop layer 58 preferably also serves as a CMP stop layer (also known as a shield layer) in the illustrated process, and may eventually serve as an antireflective layer for lithography.

The skilled artisan will readily appreciate that the insulating layers can comprise any of a number of suitable dielectric materials. For example, dielectric materials have recently been developed that exhibit low permittivity (low k), as compared to conventional oxides. These low k dielectric materials include polymeric materials, porous materials and fluorine-doped oxides.

The etch stop layers of the illustrated embodiment each comprise a material exhibiting different etch rates relative to the insulating layers, allowing better control of the etching processes. In the illustrated embodiment, the etch stop layers comprise silicon carbide (SiC), preferably provided to a thickness of between about 30 Å and 500 Å, and more preferably between about 50 Å and 200 Å.

Figure 4:
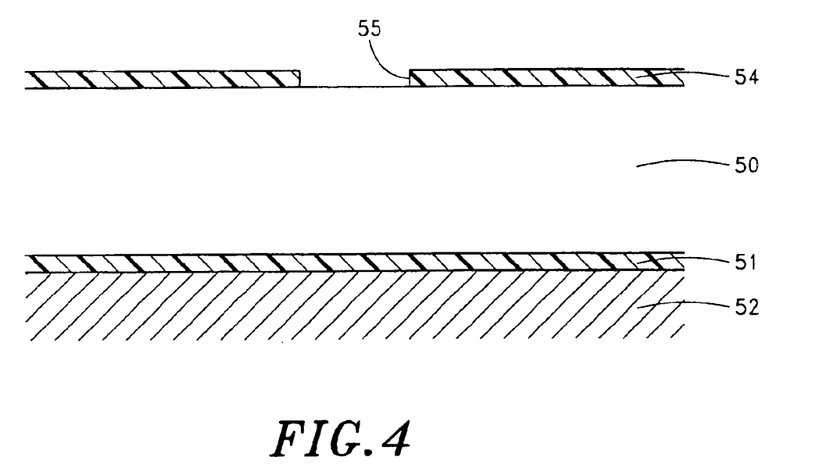

After the lower insulating layer 50 and etch stop 54 are formed, a mask and etch process transfers a pattern of openings 55 to the etch stop 54. The second or upper insulating layer 56 and CMP stop 58 are then formed over the hard mask.

Figure 5:
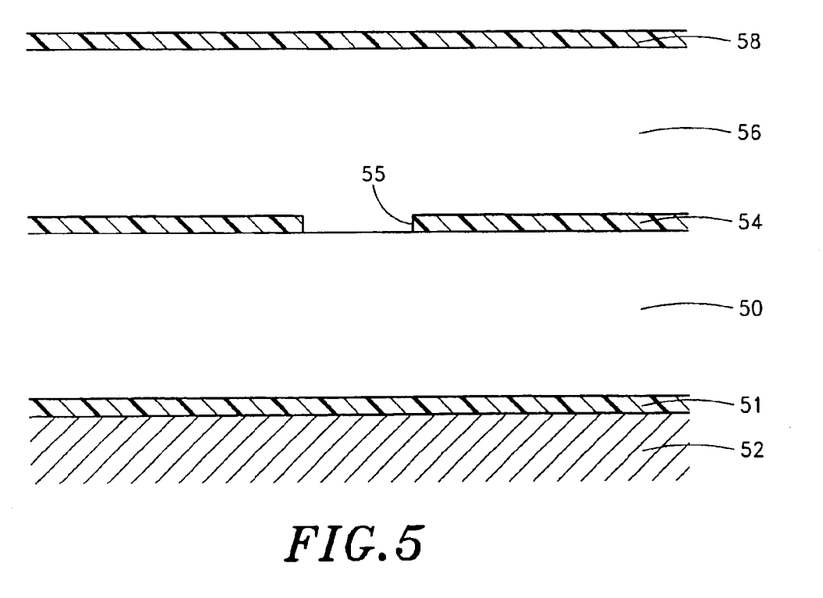

The substrate is masked and trenches 60 are etched through the upper insulating layer, preferably stopping on exposed portions of the first etch stop layer. As will be understood by the skilled artisan, the trenches are etched across the insulating layer in patterns desired for metal lines, in accordance with an integrated circuit design.

Figure 6:
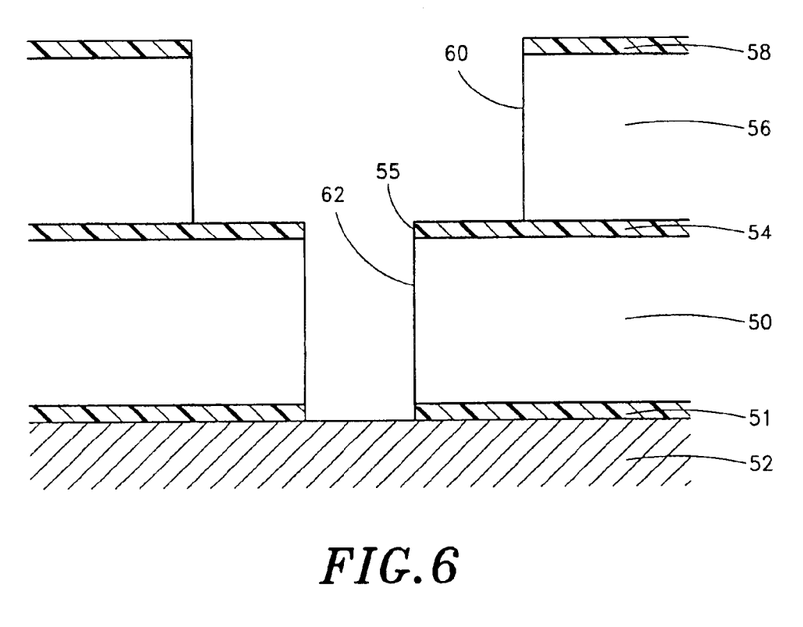

Continued etching through the hard mask defines contact vias 62 extending downwardly from the bottom of the trench 60 and through the lower insulating layer to expose conductive elements below. The contact vias 62 are defined by the openings in the hard mask at discrete locations along the trenches.

Figure 7:
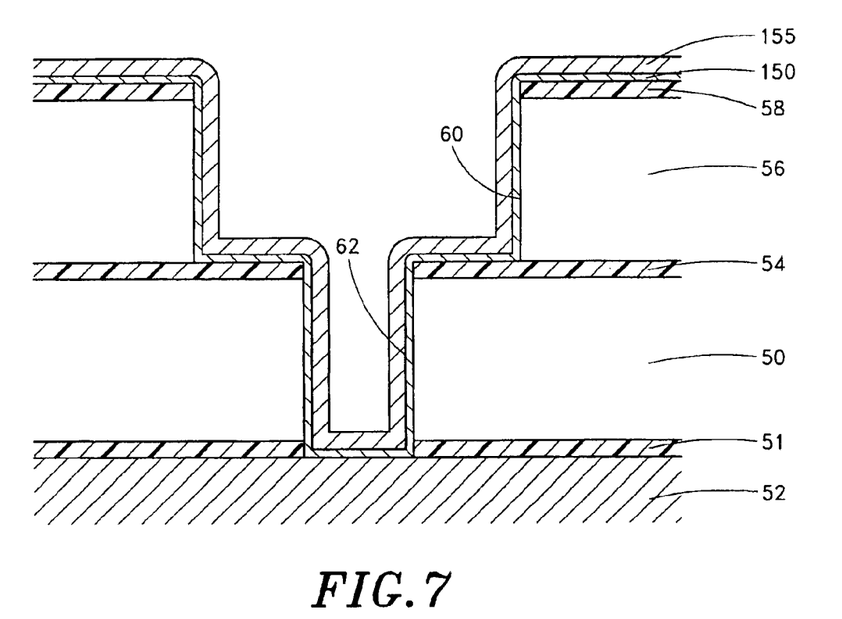
Figure 8:
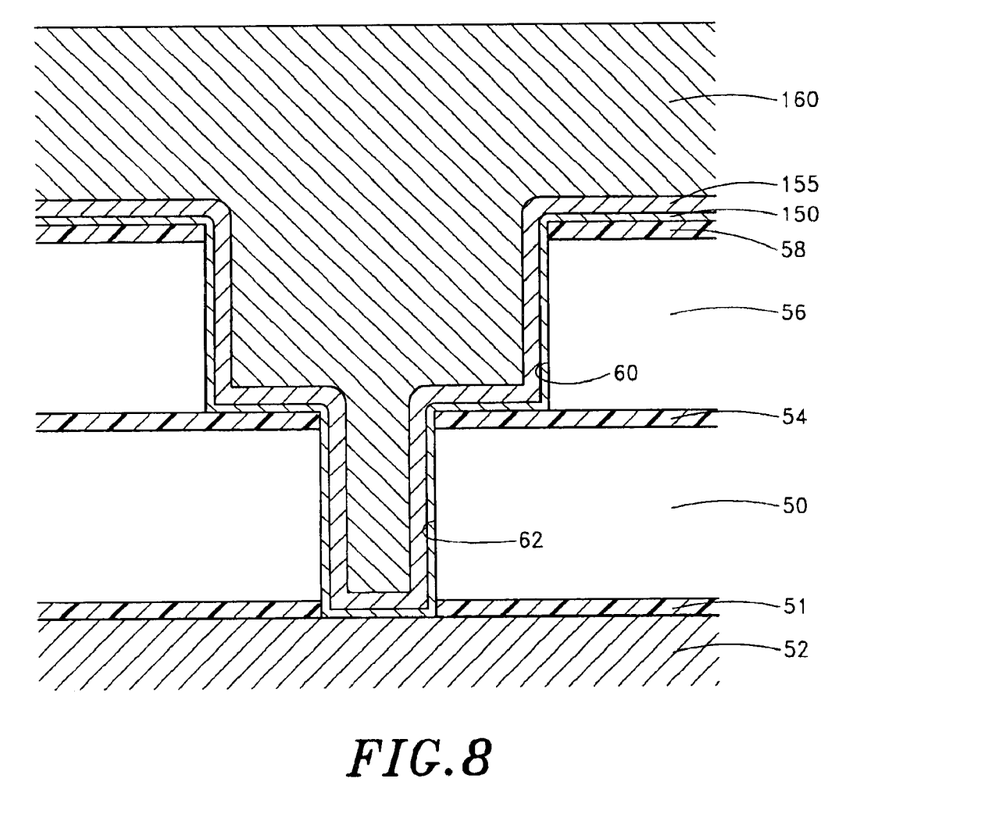

The contact vias and trenches may be lined, such as with a diffusion barrier layer 150 and a seed layer 155. The contact vias and trenches are then filled with a conductive material, typically copper 160.

Figure 9:
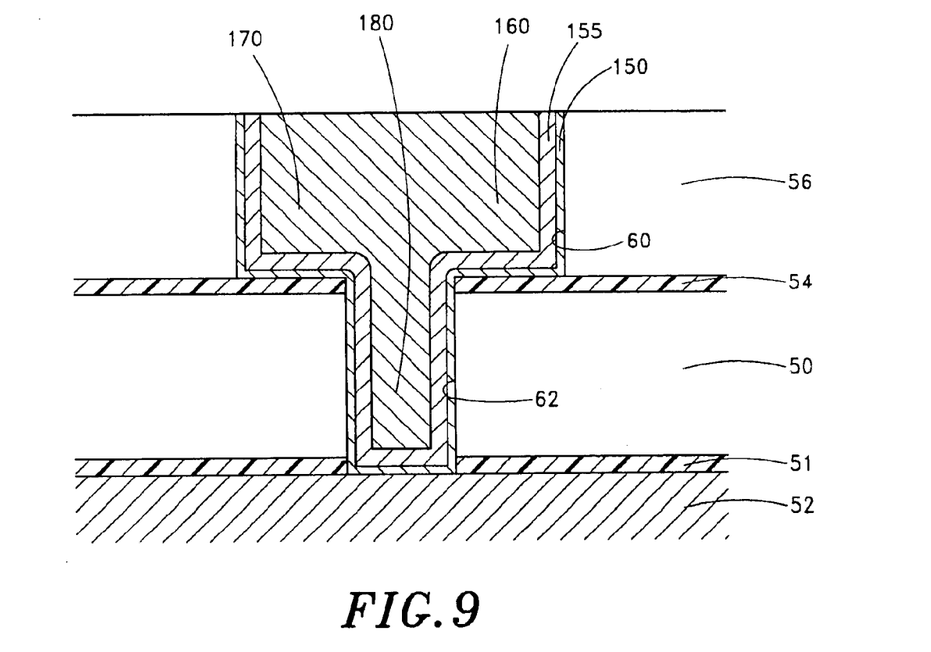

The structures are then planarized by chemical mechanical planarization (CMP) or other etch back process to leave isolated lines 170 within the trenches, having integral contacts extending downwardly therefrom 180. A layer of copper oxide is typically present on the polished copper surface following CMP. Oxidation of the copper surface may also occur during exposure to the clean room atmosphere, such as during storage or transport of the substrate.

The above steps are repeated until a structure having the desired properties is formed. Typically in an IC structure, the steps are repeated anywhere from 1 to 8 times to produce interconnecting circuits.

Copper Oxide Reduction

As described above, an etch stop layer is preferably deposited on a substrate that comprises at least one copper metal layer, such as a conductive element forming part of a lower interconnect layer in an integrated circuit. To some extent, this copper metal layer may have been oxidized to a copper oxide (CuO) layer. The oxidation may result from any event, such as through exposure to a clean room atmosphere while wafers are transported or stored following copper deposition. In other examples, a copper oxide layer may be present following a CMP process or may have been intentionally deposited. The presence of copper oxide may interfere with subsequent process steps. For example, the presence of copper oxide has been found to interfere with the adhesion of a SiC etch stop layer that is subsequently deposited over the copper layer. At least partial reduction of the copper oxide to copper improves the quality of the overlying etch stop layer, particularly preventing pinholes in SiC and SiOC.

In addition, because the amount of copper oxide increases with aging of the copper layer, the quality of the overlying etch stop layer may be inconsistent from substrate to substrate. Reduction of the copper oxide layer to copper prior to etch stop deposition thus allows for consistent, high quality etch stop layers.

In one aspect of the present invention, a CuO layer is reduced at least partially to Cu prior to deposition of an etch stop layer thereon. At least partial reduction of the CuO to Cu may enhance the nucleation of silicon carbide or silicon oxycarbide etch stop layers on copper layers and thus prevent the formation of pinholes during deposition.

In the preferred embodiment the CuO layer is reduced by exposure to an organic reducing agent that is capable of removing oxygen from the metal oxide, leaving elemental copper on the substrate. Preferably the CuO layer is reduced by exposure to an organic reducing agent in vapor form.

Figure 10:
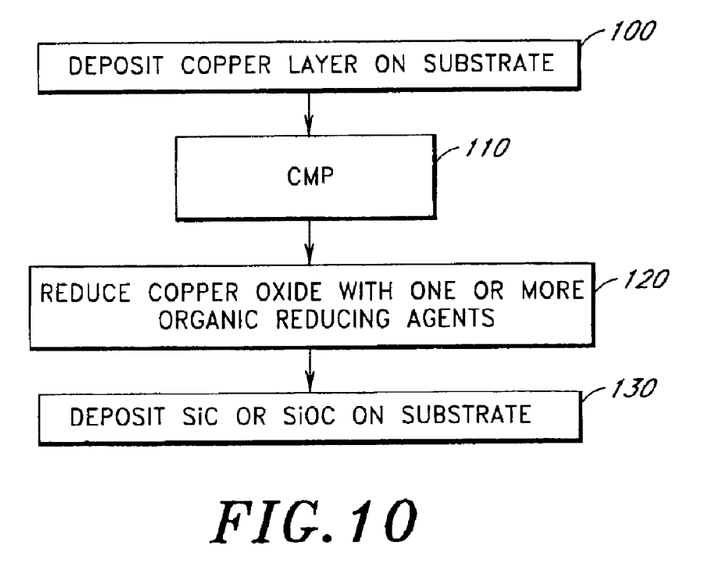
FIG. 10 is a flow chart describing the preferred process for depositing a SiC layer on copper.

A preferred embodiment is depicted in FIG. 10. A copper layer is deposited on a substrate in a reaction chamber 100. The copper layer is then subject to a CMP process 110, producing a polished copper layer. Following the CMP process the polished copper layer is at least partially oxidized. The substrate containing the copper layer to be reduced is then placed in a reaction space, such as a plasma-enhanced chemical vapor deposition (PECVD) reaction chamber, and the reaction space is evacuated to vacuum. The organic reducing agent is preferably vaporized and fed to the reaction space, optionally with the aid of an inert carrier gas, such as nitrogen. In one embodiment a vapor mixture is used, comprising two or more reducing agents.

The reducing agent vapor is contacted with the substrate, preferably at low pressure, whereby the copper oxide layer is reduced at least partly to copper metal and the reducing agent is oxidized 120. Typically the reaction space is then purged with an inert carrier gas to remove the unreacted organic reducing agent and the reaction products and/or by-products.

The reactions between copper oxide and the organic reducing agent may be carried out in a wide temperature range, even as low as room temperature. Preferably, reduction with an organic reducing agent is carried out at low temperatures. Kinetic factors and the diffusion rate of oxygen from copper to the copper surface set a lower limit to the actual process temperatures that can be applied successfully. The temperature in the reaction space is preferably in the range of 200 to 450° C., more preferably 300 to 430° C. and even more preferably 310 to 400° C. In the case of very thin metal oxide films, the reduction temperature can be even lower than 200° C. If the reduction and subsequent silicon carbide or silicon oxycarbide etch stop deposition are carried out in situ, reduction is preferably carried out at the same temperature as deposition, preferably 400° C. If reduction and deposition are not carried out in situ, the reduction temperature may be less than 400° C.

The pressure in the reaction space is preferably from 0.01 to 20 mbar, more preferably from 1 to 10 mbar.

The processing time will vary according to the thickness of the layer to be reduced. A layer of copper oxide having a thickness of up to 300 to 400 nm can be reduced in approximately 3 to 5 minutes. For layers having a thickness of approximately 0.1 to 10 nm, the processing time is in the order of seconds.

Following reduction of the copper oxide a silicon carbide or silicon oxycarbide layer is deposited on the substrate 130. Silicon carbide or silicon oxycarbide deposition may be carried out by any method known in the art, such as by PECVD. As described in more detail below, the copper oxide reduction 120 and silicon carbide or silicon oxycarbide deposition 130 may be carried out in situ, in the same reaction chamber.

Preferred Reducing Agents

According to the preferred embodiment of the present invention, CuO is reduced to copper with one or more organic reducing agents. The organic reducing agents preferably have at least one functional group selected from the group consisting of alcohol (—OH), aldehyde (—CHO), and carboxylic acid (—COOH).

The need for sufficient vapor pressure, sufficient thermal stability at the process temperature and the need for sufficient reactivity are preferably considered in selecting the reducing agent(s) to be used. Sufficient vapor pressure means that there should be enough source chemical molecules in the gas phase near the substrate to enable reduction reactions. Sufficient thermal stability means, in practice, that the reducing agent itself should not form growth-disturbing condensable phases on the substrate or leave harmful levels of impurities on the substrate through thermal decomposition. Further selection criteria include the availability of the chemical at high purity and the ease of handling.

The reducing agents are also preferably selected such that the reaction by-products are volatile and can be easily removed from the reaction space. In the reduction of copper oxide, the reducing agent is oxidized. Thus, alcohols are oxidized into aldehydes and ketones, aldehydes are oxidized into carboxylic acids and carboxylic acids are oxidized into carbon dioxide. Depending on the specific reactants, water may be formed as a gaseous by-product.

In one embodiment, reducing agents that comprise relatively bulky molecules are used, such as alcohols, aldehydes and carboxylic acids. Bulky source chemical molecules do not easily diffuse inside the metal oxide film. Thus, the reduction reaction takes place only at the surface of the metal oxide layer. Without wishing to be held to a particular theory, it is believed that during the reduction process, oxygen ions diffuse toward the surface where oxygen is depleted by the reducing chemicals. Gaseous by-products are not formed inside the film, but only at the surface. The structural integrity of the metal film is thereby preserved and the formation of pinholes in the film is avoided.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

$$R^1\text{—OH} \qquad (I)$$

wherein $R^1$ is a linear or branched $C_1$–$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

(II)

wherein each $R^1$ is selected independently from the group of linear or branched $C_1$–$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

(III)

wherein each $R^1$ is selected independently from the group of linear or branched $C_1$–$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5–6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}\text{—}R^2\text{—OH} \qquad (IV)$$

wherein X is selected from the group consisting of F, Cl, Br and I, n is an integer from 0 to 2 and $R^2$ is selected from the group of linear or branched $C_1$–$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3\text{—CHO} \qquad (V)$$

wherein $R^3$ is selected from the group consisting of hydrogen and linear or branched $C_1$–$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC\text{—}R^4\text{—CHO} \qquad (VI)$$

wherein $R^4$ is a linear or branched $C_1$–$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5\text{—COOH} \qquad (VII)$$

wherein $R^5$ is hydrogen or linear or branched $C_1$–$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

Alternative Reduction Chemistries

While copper oxide reduction prior to etch stop deposition is preferably achieved by contacting the substrate with organic reducing agents, particularly large molecule vapor phase reducing agents, other methods of reduction are contemplated. In one embodiment, copper oxide is reduced by treatment with $H_2$ plasma prior to deposition of a silicon carbide or silicon oxycarbide etch stop layer. Reduction of copper oxide to copper with $H_2$ plasma is described, for example, in U.S. Pat. No. 6,033,584. Briefly, the substrate comprising the copper oxide is placed in a reaction chamber, such as a PECVD reaction chamber. A gas mixture comprising $H_2$ is allowed to flow into the chamber and Radio Frequency (RF) power is applied to create a plasma discharge in the $H_2$ gas. The plasma discharge etches the copper oxide, leaving elemental copper. Care must be taken not to damage the copper surface or other exposed substrate surfaces.

In a further embodiment, copper oxide is reduced by exposure to $H_2$ gas at elevated temperature. Briefly, the substrate comprising the copper oxide is placed in a reaction chamber. $H_2$ gas is allowed to flow into the reaction chamber. The temperature of the reaction chamber is set to between about 400° C. and 600° C., more preferably to about 500° C.

According to still another embodiment, carbon monoxide (CO) is used for reducing copper oxide into elemental copper.

In Situ Processing

In one embodiment, the copper oxide reduction is carried out in situ in the same reaction space as subsequent processes, such as the deposition of an overlying etch stop layer and/or the deposition of an insulating dielectric layer. For example, in one embodiment the copper oxide reduction takes place prior to plasma enhanced chemical vapor deposition (PECVD) of silicon carbide or silicon oxycarbide in a CVD reactor such as the Eagle 10™ reactor (ASM, Japan).

Figure 11:
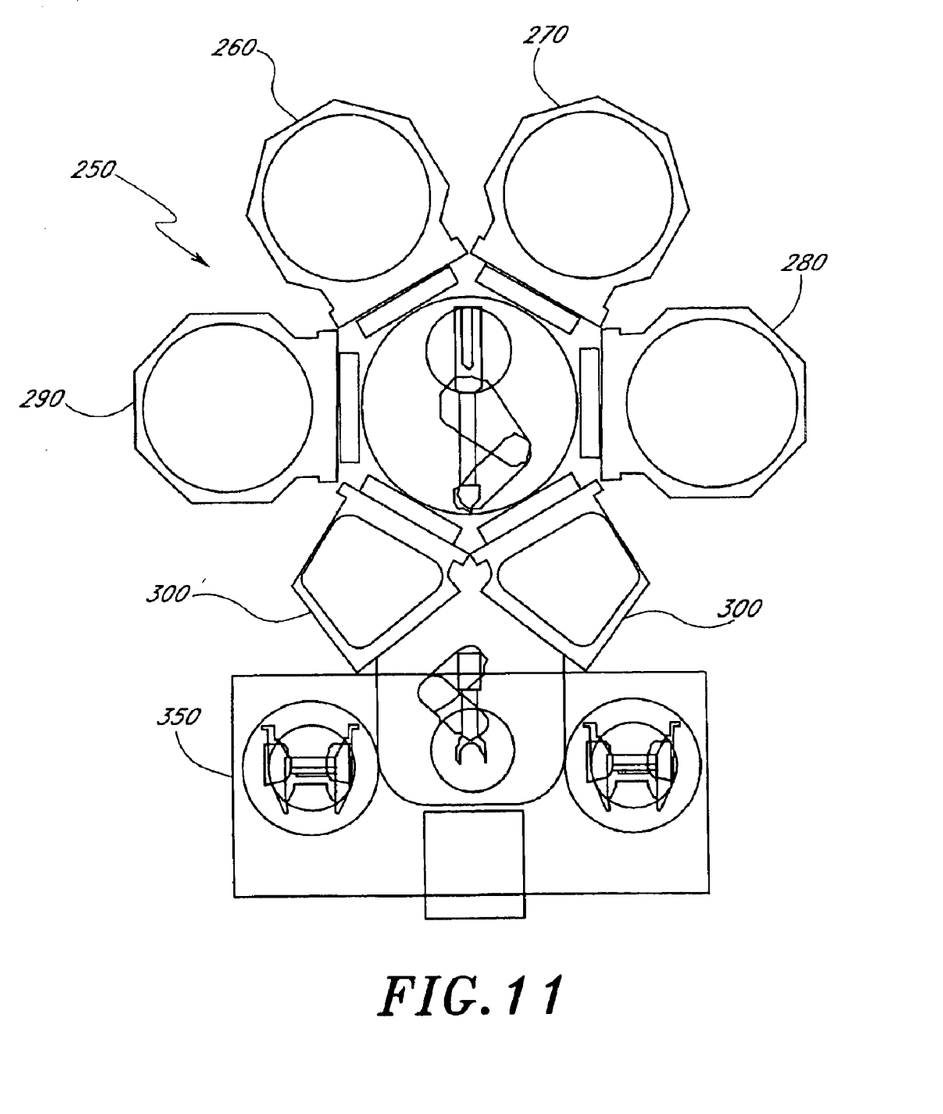
FIG. 11 is a schematic illustration of a cluster tool that may be used with the process disclosed herein.

In another embodiment the copper oxide reduction takes place in a module clustered to another reactor, such as on a Rapidfire™ cluster tool (ASM Japan). FIG. 11 is a schematic illustration of a cluster tool 250 that may be used in accordance with this embodiment. A copper oxide reduction module 260 may be clustered with a module 270 in which deposition of an overlying etch stop layer will occur. Other process steps may be carried out in additional modules 280. In one embodiment the copper oxide reduction module 260 is clustered with a dielectric deposition tool 290. Carriers with wafers are disposed on the front end loading station 350 and transferred to the process module via load lock chambers 300.

The copper oxide reduction module may be dedicated to copper oxide reduction or may also be used for other processes. If the module is used for other processes, the other processes are preferably carried out at temperatures comparable to those used for copper oxide reduction. In one embodiment, reduction of copper oxide with one or more organic reactants is carried out in a reactor that is subsequently used to deposit AURORA™ low-k dielectric materials on the substrate.

EXAMPLE 1

Reduction of CuO with Methanol Vapor

A silicon substrate having a copper oxide coating on copper metal is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Methanol vapor is mixed with nitrogen gas, introduced to the reaction chamber and contacted with the substrate.

Excess methanol and reaction by-products are purged from the reaction chamber by flowing nitrogen gas. A layer of silicon carbide is deposited over the copper layer by PECVD in the same reaction chamber.

EXAMPLE 2

Reduction of CuO with Ethanol Vapor

A silicon substrate having a copper oxide coating on copper metal is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Ethanol vapor is mixed with nitrogen gas, introduced to the reaction chamber and contacted with the substrate.

Excess ethanol and reaction by-products are purged from the reaction chamber by flowing nitrogen gas. A layer of silicon carbide is deposited over the copper layer by PECVD in the same reaction chamber.

EXAMPLE 3

Reduction of CuO with 2-Propanol Vapor

A silicon substrate having a copper oxide coating on copper metal is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

2-propanol (also known as isopropanol) vapor is mixed with nitrogen gas, introduced to the reaction chamber and contacted with the substrate.

Excess 2-propanol and reaction by-products are purged from the reaction chamber by flowing nitrogen gas. A layer of silicon carbide is deposited over the copper layer by PECVD in the same reaction chamber.

EXAMPLE 4

Reduction of CuO with tert-Butanol Vapor

A silicon substrate having a copper oxide coating on copper metal is loaded into the reaction chamber of an Eagle 10™ reactor. The reaction chamber is evacuated to vacuum and heated to greater than 385° C. The pressure of the reaction chamber is adjusted to about 5–10 mbar with flowing nitrogen gas.

Tert-butanol vapor is mixed with nitrogen gas, introduced to the reaction chamber and contacted with the substrate.

Excess tert-butanol and reaction by-products are purged from the reaction chamber by flowing nitrogen gas. A layer of silicon carbide is deposited over the copper layer by PECVD in the same reaction chamber.

EXAMPLE 5

Reduction of CuO with Butyraldehyde Vapor

A silicon substrate having a copper oxide coating on copper metal is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Butyraldehyde vapor is mixed with nitrogen gas, introduced to the reaction chamber and contacted with the substrate.

Excess butyraldehyde and reaction by-products are purged from the reaction chamber by flowing nitrogen gas. A layer of silicon carbide is deposited over the copper layer by PECVD in the same reaction chamber.

EXAMPLE 6

Reduction of CuO with Formic Acid Vapor

A silicon substrate having a copper oxide coating on copper metal is loaded into the reaction chamber of an Eagle 10™ reactor. The reaction chamber is evacuated to vacuum and heated to 310° C. The pressure of the reaction chamber is adjusted to about 5–10 mbar with flowing nitrogen gas.

Formic acid vapor is mixed with nitrogen gas, introduced to the reaction chamber and contacted with the substrate.

Excess formic acid and reaction by-products are purged from the reaction chamber by flowing nitrogen gas. A layer of silicon carbide is deposited over the copper layer by PECVD in the same reaction chamber.

EXAMPLE 7

Reduction of CuO with Acetic Acid Vapor

A silicon substrate having a copper oxide coating on copper metal is loaded into the reaction chamber of an Eagle 10™ reactor. The reaction chamber is evacuated to vacuum and heated to 360° C. The pressure of the reaction chamber is adjusted to about 5–10 mbar with flowing nitrogen gas.

Acetic acid vapor is mixed with nitrogen gas, introduced to the reaction chamber and contacted with the substrate.

Excess acetic acid and reaction by-products are purged from the reaction chamber by flowing nitrogen gas. A layer of silicon carbide is deposited over the copper layer by PECVD in the same reaction chamber.

EXAMPLE 8

Reduction of CuO with Plasma

A silicon substrate having a copper oxide coating on copper metal is loaded into the reaction chamber of an Eagle 10™ reactor. The reaction chamber is evacuated to vacuum and heated to approximately 300° C. The pressure of the reaction chamber is adjusted to about 5–10 mbar with flowing gas comprising hydrogen.

A plasma discharge or glow is created in the gas by the application of RF power. Plasma treatment is continued for approximately 2 minutes.

Reaction byproducts are purged from the reaction chamber with flowing nitrogen gas. A layer of silicon carbide is deposited over the copper layer by PECVD in the same reaction chamber.

EXAMPLE 9

Reduction of CuO with Hydrogen

A silicon substrate having a copper oxide coating on copper metal is loaded into the reaction chamber of an Eagle 10™ reactor. The reaction chamber is evacuated to vacuum, heated to approximately 500° C. and the pressure of the reaction chamber is adjusted to about 5–10 mbar with flowing nitrogen gas.

Hydrogen gas is mixed with nitrogen gas (10% hydrogen by volume), introduced to the reaction chamber and contacted with the substrate.

Reaction byproducts are purged from the reaction chamber with flowing nitrogen gas. A layer of silicon carbide is deposited over the copper layer by PECVD.

The preferred copper oxide reduction method disclosed herein utilizes inexpensive chemicals. In addition, the processing temperatures may be low and there is no need for additional energy, e.g. in the form of plasma. Further, by reducing the copper oxide on a substrate prior to deposition of a silicon carbide or silicon oxycarbide etch stop layer, nucleation of silicon carbide or silicon oxycarbide is enhanced and the formation of pinholes is reduced.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A process for producing an integrated circuit comprising reducing copper oxide on a substrate to leave copper from the copper oxide on the substrate while removing oxygen from the copper oxide by exposure to one or more vapor phase organic reducing agents prior to deposition of a layer comprising silicon carbide, wherein the vapor phase organic reducing agent is not plasma activated.

2. The process of claim 1, wherein the layer further comprises oxygen.

3. The process of claim 1, wherein the layer serves as a hard mask.

4. The process of claim 1, wherein the organic reducing agent comprises at least one functional group selected from the group consisting of alcohol (—OH), aldehyde (—CHO), and carboxylic acid (—COOH).

5. The process of claim 4, wherein the organic reducing agent is selected from the group consisting of primary alcohols, secondary alcohols, tertiary alcohols, polyhydroxyalcohols, cyclic alcohols, and halogenated alcohols.

6. A process for producing an integrated circuit comprising reducing copper oxide on a substrate by exposure to one or more vapor phase organic reducing agents prior to deposition of a layer comprising silicon carbide, wherein the vapor phase organic reducing agent is not plasma activated, and wherein said organic reducing agent is selected from the group consisting of:

compounds having the general formula $R^3$—CHO, wherein $R^3$ is hydrogen or a linear or branced $C_1$–$C_{20}$ alkyl or alkenyl group;

compounds having the general formula OHC—$R^4$—CHO, wherein $R^4$ is a linear or branched $C_1$–$C_{20}$ saturated or unsaturated hydrocarbon;

a compound of the formula OHC—CHO;

halogenated aldehydes; and other derivatives of aldehydes.

7. A process for producing an integrated circuit comprising reducing copper oxide on a substrate by exposure to one or more vapor phase organic reducing agents prior to deposition of a layer comprising silicon carbide, wherein the vapor phase organic reducing agent is not plasma activated, and wherein the organic reducing agent is selected from the group consisting of:

compounds of the general formula $R^5$COOH, wherein $R^5$ is hydrogen or a linear or branched $C_1$–$C_{20}$ alkyl or alkenyl group;

polycarboxylic acids;

halogenated carboxylic acids; and other derivatives of carboxylic acids.

8. The process of claim 1, wherein said copper oxide is present after a chemical mechanical polishing (CMP) step.

9. The process of claim 1, wherein said copper oxide is formed by exposure to a clean room atmosphere.

10. The process of claim 1, wherein said exposure takes place in a first reaction chamber.

11. The process of claim 10, wherein said layer serves as an etch stop.

12. The process of claim 11, wherein deposition of the etch stop layer also takes place in the first reaction chamber.

13. The process of claim 11, wherein deposition of the etch stop layer takes place in a second reaction chamber clustered with the first reaction chamber.

14. The process of claim 11, wherein the temperature in the reaction chamber is less than about 450° C.

15. The process of claim 11, wherein the temperature in the reaction chamber is between about 200 and 430° C.

16. The process of claim 11, wherein the temperature in the reaction chamber is about 400° C.

17. The process of claim 11, wherein reduction of copper oxide and deposition of the etch stop are carried out in the same reaction chamber at about the same temperature.

18. A process for producing an integrated circuit comprising the following steps, in order:

depositing a copper layer on a substrate;

subjecting the copper layer to a CMP process;

reducing copper oxide on the substrate to leave copper from the copper oxide on the substrate while removing oxygen from the copper oxide by contacting the substrate with one or more vapor phase organic reducing agents; and depositing an etch stop layer on the substrate, wherein the organic reducing agents comprise at least one functional group selected from the group consisting of alcohol (—OH), aldehyde (—CHO), and carboxylic acid (—COOH), wherein the vapor phase organic reducing agent is not plasma activated.

19. The process of claim 18, wherein the etch stop layer comprises silicon carbide.

20. The process of claim 19, wherein the etch stop layer further comprises oxygen.

21. The process of claim 18, wherein the etch stop layer comprises silicon nitride.

* * * * *

UNITED STATES PATENT AND TRADEMARK OFFICE
CERTIFICATE OF CORRECTION

PATENT NO. : 6,878,628 B2  Page 1 of 1
APPLICATION NO. : 09/975466
DATED : April 12, 2005
INVENTOR(S) : Sophie et al.

It is certified that error appears in the above-identified patent and that said Letters Patent is hereby corrected as shown below:

Title Page, item 56

On page 2, under "OTHER PUBLICATIONS" column 1, line 13, please insert --"-- before "Oral".

On page 2, under "OTHER PUBLICATIONS" column 1, lines 41-42, please delete "Sundani et al., "Oral Presentation of dual damascene process" slides." (duplicate entry)

In Claim 6, at column 12, line 45, please replace "branced" with -- branched --.

Signed and Sealed this

Twenty-fifth Day of July, 2006

JON W. DUDAS
*Director of the United States Patent and Trademark Office*